United States Patent
Park et al.

(10) Patent No.: US 8,791,497 B2
(45) Date of Patent: Jul. 29, 2014

(54) MOLD FOR LIGHT-EMITTING DEVICE PACKAGE

(71) Applicant: Samsung Electronics Co., Ltd., Suwon-si (KR)

(72) Inventors: Hun-yong Park, Seoul (KR); Dae-young Kim, Hwaseong-si (KR); Choo-ho Kim, Yongin-si (KR); Jomg-o Lim, Suwon-si (KR); Yong-rak Jeong, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/677,109

(22) Filed: Nov. 14, 2012

(65) Prior Publication Data

US 2013/0168726 A1 Jul. 4, 2013

(30) Foreign Application Priority Data

Dec. 30, 2011 (KR) ......................... 10-2011-0147411

(51) Int. Cl.
*H01L 33/52* (2010.01)

(52) U.S. Cl.
USPC .......................................... 257/100

(58) Field of Classification Search
CPC ..................... H01L 33/52; B29C 45/14819
USPC ............................................ 257/100
See application file for complete search history.

(56) References Cited

U.S. PATENT DOCUMENTS

| 5,817,545 | A | 10/1998 | Wang et al. |
| 2003/0168720 | A1 | 9/2003 | Kamada |
| 2008/0268559 | A1 | 10/2008 | Jung |
| 2010/0330714 | A1 | 12/2010 | Jung et al. |

FOREIGN PATENT DOCUMENTS

| KR | 10-0262812 B1 | 8/2000 |
| KR | 10-0631420 B1 | 9/2006 |
| KR | 10-0761387 B1 | 9/2007 |
| KR | 10-0947400 B1 | 3/2010 |

*Primary Examiner* — Tran Tran

(74) *Attorney, Agent, or Firm* — McDermott Will & Emery LLP

(57) ABSTRACT

A light-emitting device package mold and a method of manufacturing a lens of a light-emitting device package. The light-emitting device package mold includes a convex unit, an inner circumference of which has a hemispherical shape; a flat panel unit that forms a flat panel by extending from an edge of the convex unit; a cylindrical unit extending in a vertical direction with respect to an upper surface of the flat panel unit; and an injection hole and a discharge hole that penetrate through the convex unit, wherein the discharge hole is formed in a horizontal direction with respect to the flat panel unit.

16 Claims, 5 Drawing Sheets

MOLD FOR LIGHT-EMITTING DEVICE PACKAGE

CROSS-REFERENCE TO RELATED APPLICATIONS

This application claims the benefit of Korean Patent Application No. 10-2011-0147411, filed on Dec. 30, 2011, in the Korean Intellectual Property Office, the disclosure of which is incorporated herein in its entirety by reference.

BACKGROUND

1. Field

The present disclosure relates to molds for manufacturing molding members of light-emitting device packages.

2. Description of the Related Art

Light-emitting device chips, for example, light-emitting diodes (LEDs), are semiconductor devices that emit various colors of light implemented by a light source having a PN junction of compound semiconductors. LEDs have numerous advantages. LEDs have a long lifetime, and can be miniaturized. LEDs can be driven at a low voltage due to high directionality. Also, LEDs are able to withstand impact and vibration, so they do not require a preheating time and a complicated driving. LEDs can be packaged in various types. These various advantages permit LEDs to be applied for various purposes.

A light-emitting device package is formed as the following procedure. After mounting a light-emitting device chip on a lead frame or a substrate on which an electrode pattern is formed, an electrode of the light-emitting device chip is electrically connected to the lead frame or the electrode pattern, and, then, a molding member is formed on the lead frame or the electrode pattern.

Recently, a molding member is formed to include a lens thereon, and thus, the process of additionally disposing a lens on the molding member becomes unnecessary.

In order to form a molding member that includes a lens on a light-emitting device chip, a molding resin is injected into a mold having a lens shape.

The mold includes an inlet for injecting a molding resin and an air ventilator for discharging air to the outside form the mold. A guide groove in the molding member readily injects and discharges a resin. However, if resin remains and protrudes in the guide groove of the molding member when a mold is removed after injecting a molding resin, a pick-up unit may contact the remained resin in the guide groove in a subsequent pick-up process that uses a vacuum. Thus, the contact of the pick-up unit with the guide groove becomes deteriorated, which hampers the subsequent pick-up process.

A need exists for developing a technique for preventing a lens unit from damages due to the leaked molding resin, and preventing pores from being formed in the molding member.

SUMMARY

Provided are light-emitting device package molds that prevent damage to a light-emitting device package due to leaking of a molding resin and prevents the generation of air pores in a molding member when the molding member of the light-emitting device package is formed.

Additional aspects will be set forth in part in the description which follows and, in part, will be apparent from the description, or may be learned by practice of the presented embodiments.

An aspect of the present disclosure encompasses a light-emitting device package mold including: a convex unit, of which an inner circumference has a hemispherical shape; a flat panel unit that extends from an edge of the convex unit; a cylindrical unit extending in a vertical direction with respect to an upper surface of the flat panel unit; and an injection hole and a discharge hole that penetrate through the convex unit. The discharge hole extends in a direction substantially parallel to the flat panel unit.

The injection hole and the discharge hole may be located separate from the flat panel unit.

The light-emitting device package mold may further include a discharge member that surrounds the discharge hole and extends in a vertical direction on an outer circumference of the convex unit.

The discharge member may be formed lower than the cylindrical unit in a vertical direction with respect to the flat panel unit.

The injection hole and the discharge hole may be respectively closer to the flat panel unit than a vertical middle point of the convex unit.

The light-emitting device package mold may be formed of a transparent material.

The light-emitting device package mold may further include a protrusion unit that protrudes in a direction opposite to the extending direction of the cylindrical unit from a lower surface of the flat panel unit and surrounds an edge of the convex unit.

Another aspect of the present disclosure relates to a light-emitting device package. The light-emitting device package includes a convex unit, of which an inner circumference has a hemispherical shape; a flat panel unit extending from an edge of the convex unit; a cylindrical unit extending in a vertical direction with respect to an upper surface of the flat panel unit; and an injection hole and a discharge hole that penetrate through the convex unit and face in a horizontal direction with respect to the flat panel unit.

Still another aspect of the present disclosure is directed to a light-emitting device package mold including: a convex unit, of which an inner circumference has a hemispherical shape; a flat panel unit extending from an edge of the convex unit; a cylindrical unit extending in a vertical direction with respect to the flat panel unit from an upper surface of the flat panel unit; a protrusion unit that protrudes in a direction opposite to the extending direction of the cylindrical unit from the flat panel unit and surrounds an edge of the convex unit; and an injection hole that penetrate through the convex unit. The protrusion unit comprises at least one opening.

Another aspect of the present disclosure provides a light-emitting device packaging molding device. The light-emitting device packaging molding system comprises a light-emitting device package, a light-emitting device package mold, and a protruding ring disposed on the substrate and circling around the LED chip at a predetermined distance from the LED chip.

The light-emitting device package includes a substrate, and a light-emitting device (LED) chip disposed on the substrate. The light-emitting device package mold includes a convex unit, of which an inner circumference has a hemispherical shape; a flat panel unit by extending from an edge of the convex unit; a cylindrical unit extending in a vertical direction with respect to an upper surface of the flat panel unit; a protrusion unit that protrudes in a direction opposite to the extending direction of the cylindrical unit from the flat panel unit and surrounds an edge of the convex unit; and an injection hole that penetrates through the convex unit, wherein the protruding ring contacts with the protrusion unit to seal a space defined by the convex unit and the substrate.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
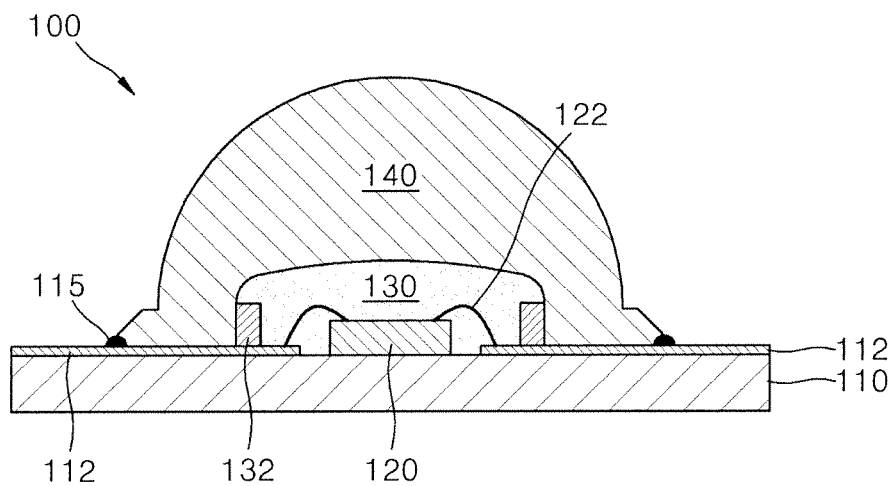
FIGS. 1 and 2 are schematic cross-sectional views showing light-emitting device packages according to embodiments of the present disclosure.

Reference will now be made in detail to embodiments, examples of which are illustrated in the accompanying drawings. In the drawings, like reference numerals refer to like elements throughout and the thicknesses or sizes of each constituent element are exaggerated for clarity. It will be understood that when an element or layer is referred to as being "on" another element or layer, the element or layer may be directly on another element or layer or intervening elements or layers.

FIG. 1 is a schematic cross-sectional view showing a light-emitting device package 100 according to an embodiment of the present disclosure.

Referring to FIG. 1, the light-emitting device package 100 may include a light-emitting device chip 120 disposed on a substrate 110, a sealing member 130 that covers the light-emitting device chip 120, and a lens 140.

Electrode wires 112 are formed on the substrate 110. The electrode wires 112 are formed by patterning a metal layer (for example, Cu), and may form a current supply wiring. The substrate 110 may be formed of a metal plate, and an insulating layer may be formed on the substrate 110.

The light-emitting device chip 120 may be disposed on the substrate 110 and may be wire-bonded to the electrode wires 112 by wires 122. The light-emitting device chip 120 may be a plurality of light-emitting device chips. However, in FIG. 1, for convenience of explanation, one light-emitting device chip 120 and two electrode wires 112 are depicted. Also, the light-emitting device chip 120 in FIG. 1 has a horizontal type light-emitting device chip structure. The light-emitting device chip 120 may have a vertical type light-emitting device chip structure, and in the case of the vertical type light-emitting device chip, a lower surface of the vertical type light-emitting device chip may be disposed to directly contact one of the electrode wires 112.

A sealing dam 132 that surrounds the light-emitting device chip 120 may be formed on the substrate 110. The sealing dam 132 may be formed of an insulating material, for example, a photo solder resist (PSR) or a photo imageable solder resist.

The sealing member 130 is formed to cover the light-emitting device chip 120 within the sealing dam 132. The sealing member 130 may be formed of an epoxy resin or a silicon resin. The sealing member 130 may include a phosphor material.

The lens 140 is formed to cover the sealing member 130. The lens 140 diffuses light when the light is emitted to the outside from the light-emitting device chip 120, and has a hemispherical shape. The lens 140 may be formed of an epoxy resin or a silicon resin.

In FIG. 1, the sealing member 130 and the lens 140 are depicted as separate as an example. However, the sealing member 130 and the lens 140 that include includes a phosphor material may be formed as one body without the sealing dam 132.

In FIG. 1, reference numeral 115 is a protruding ring and the protruding ring 115 may be formed of an insulating layer 115 such as a PSR or a photo imageable solder resist. The protruding ring 115 is described below.

Figure 2:
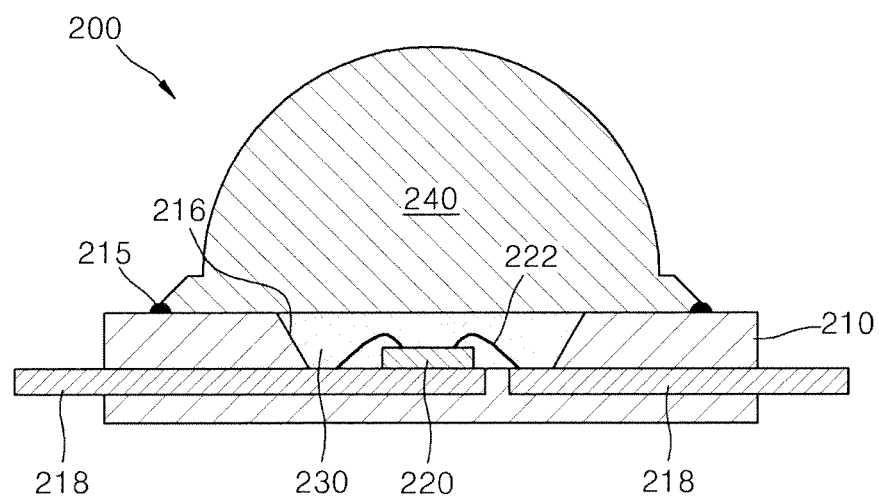

FIG. 2 is a schematic cross-sectional view showing a light-emitting device package 200 according to another embodiment of the present disclosure.

Referring to FIG. 2, the light-emitting device package 200 may include a light-emitting device chip 220 disposed on a substrate 210, a sealing member 230 that covers the light-emitting device chip 220, and a lens 240.

Lead frames 218 are disposed to be separate from each other in the substrate 210, and a reflector cup 216 that exposes the lead frames 218 is formed in the substrate 210. The light-emitting device chip 220 may be disposed on one of the lead frames 218. The light-emitting device chip 220 is connected to the lead frames 218 via wires 222. When the light-emitting device chip 220 has a vertical type electrode, a lower surface of the light-emitting device chip 220 is directly and electrically connected to the one of the lead frames 218.

A phosphor layer 230, which is formed of a phosphor material and a resin, is formed in the reflector cup 216 to cover the light-emitting device chip 220. The resin in the phosphor layer 230 may be an epoxy resin or a silicon resin.

The lens 240 that covers the phosphor layer 230 is formed on the substrate 210. The lens 240 diffuses light that is emitted to the outside from the light-emitting device chip 220. The lens 240 has a hemispherical shape. The lens 240 may be formed of an epoxy resin or a silicon resin.

Referring to FIG. 2, the reference numeral 215 is a protruding ring, and the protruding ring 215 may be formed of, for example, a PSR or a photo imageable solder resist.

A light-emitting device package mold according to the current embodiment is a mold for forming the lens 140, or the lens 140 and the sealing member 130 of FIG. 1. Also, the light-emitting device package mold according to the current embodiment may be used for forming the lens 240 of FIG. 2.

Hereinafter, a light-emitting device package mold according to the current embodiment will now be described with reference to the structure of the light-emitting device package 100 of FIG. 1.

Figure 3:
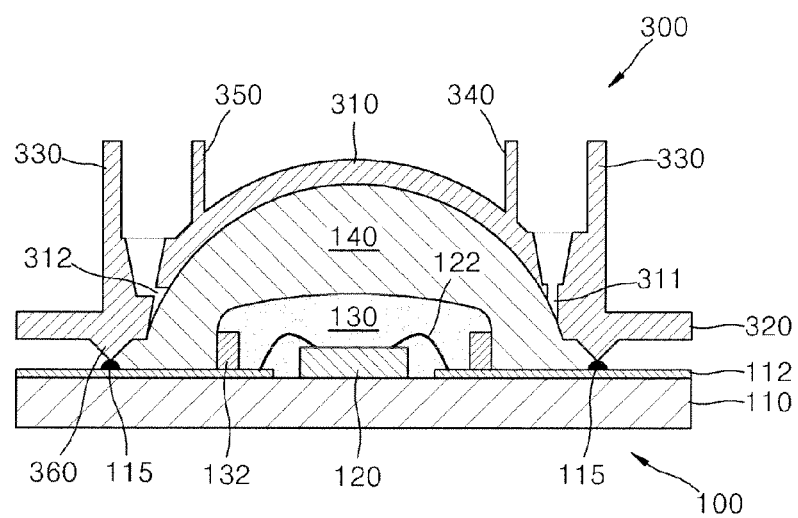
FIG. 3 is a schematic cross-sectional view showing a structure of a light-emitting device package mold according to an embodiment of the present disclosure.

FIG. 3 is a schematic cross-sectional view showing a structure of the light-emitting device package mold 300 according to an embodiment of the present disclosure. For convenience of understanding, the light-emitting device package 100 of FIG. 1 is depicted also. Like reference numerals are used to indicate elements that are substantially the same as the elements of FIG. 1 and detailed descriptions thereof are not repeated.

Referring to FIG. 3, the light-emitting device package mold 300 for forming the lens 140 of the light-emitting device package 100 is disposed on the substrate 110. The light-emitting device package mold 300 is at least a mold for forming a lens. The light-emitting device package mold 300 includes a convex unit 310, an inner circumference portion of which has a hemispherical shape, a flat panel unit 320 horizontally extending outwards from an edge of the convex unit 310, and a cylindrical unit 330 extending vertically upwards from an upper surface of the flat panel unit 320. The convex unit 310 includes two through holes. One of the through holes is an injection hole 311 for injecting a molding resin and the other of the through holes is a discharge hole 312 for discharging air in a space surrounded by the convex unit 310 to the outside.

The injection hole 311 and the discharge hole 312 are respectively separated from the flat panel unit 320 with predetermined gaps, and may be formed on locations facing each other in the convex unit 310. The injection hole 311 is formed substantially parallel to the extending direction of the cylindrical unit 330. The injection hole 311 is surrounded by an injection member 340. The injection member 340 may have a cylindrical shape. A portion of the injection member 340 may be connected to an inner wall of the cylindrical unit 330 and may be formed as one body with the cylindrical unit 330. An inner diameter of the injection member 340 connected to the injection hole 311 may gradually increase upwards. This makes the molding resin be readily injected into the injection member 340.

The discharge hole 312 may be formed parallel to the direction of the substrate 110, that is, may be horizontally formed with respect to the flat panel unit 320. The function of the discharge hole 312 is described below when an operation of the embodiment is described.

The discharge hole 312 is surrounded by a discharge member 350 and the discharge member 350 may have a cylindrical shape perpendicular to the flat panel unit 320, and the discharge hole 312 extends in a vertical direction with respect to the flat panel unit 320 along with the discharge member 350. The diameter of the discharge member 350 connected to the discharge hole 312 may gradually increase upwards.

From the flat panel unit 320, an upper edge of the discharge member 350 may be lower than that of the cylindrical unit 330.

Locations of the injection hole 311 and the discharge hole 312 may be closer to the flat panel unit 320 than a vertical middle point of the convex unit 310.

The light-emitting device package mold 300 may be formed of a transparent material, for example, a transparent resin. The transparent resin may be one selected from the group consisting of silicon, urethane resin, oxetane resin, acryl, polycarbonate, and polyimide. When the light-emitting device package mold 300 is formed of a transparent material and a molding resin is injected into a gap between the substrate 110 and the light-emitting device package mold 300, the degree of filling the molding resin may be checked with bare eyes.

A protrusion unit 360 that surrounds an edge of the convex unit 310 is formed on a lower surface of the flat panel unit 320. The protrusion unit 360 defines an outer circumference of the lens 140. The protrusion unit 360 may make a line contact with the substrate 110 since an edge of the protrusion unit 360 that contacts the substrate 110 is sharpened. The protruding ring 115 may be formed on the substrate 110, and the protrusion unit 360 may be disposed on the protruding ring 115. The protruding ring 115 makes a line contact with the protrusion unit 360, and prevents the molding resin from leaking between the substrate 110 and the protrusion unit 360.

When the light-emitting device package mold 300 makes a line contact with the substrate 110, the sealing between an inner side of the convex unit 310 and the substrate 110 may be improved when the light-emitting device package mold 300 and the substrate 110 are clamped together. Accordingly, the leaking of the molding resin may be prevented. That is, when a clamping between the convex unit 310 and the substrate 110 is performed, a pressure applied to the light-emitting device package mold 300 is concentrated on the edge of the protrusion unit 360. Therefore, the leaking of a molding resin between the substrate 110 and the protrusion unit 360 may be prevented with a low pressure.

A cross-section of the protrusion unit 360 has a triangular shape, but the present disclosure is not limited thereto. In the current embodiment, the cross-section of the protrusion unit 360 may have a hemispherical shape or a quadrangular shape.

Figure 4:
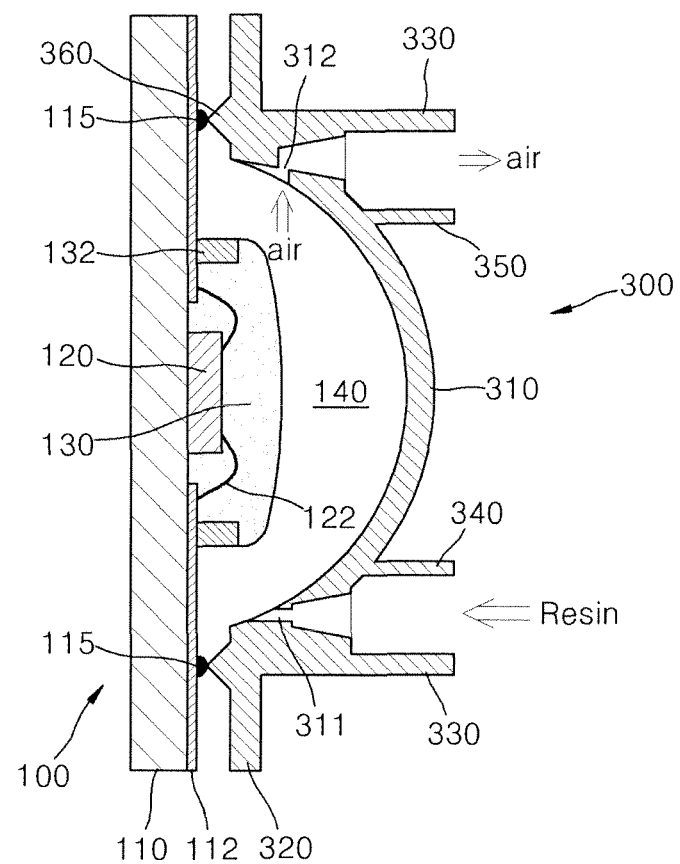
FIG. 4 is a schematic cross-sectional view illustrating a process of injecting a molding resin into the light-emitting device package mold, according to an embodiment of the present disclosure.

FIG. 4 is a schematic cross-sectional view illustrating a process of injecting a molding resin into the light-emitting device package mold 300, according to an embodiment of the present disclosure.

Referring to FIG. 4, the substrate 110 and the light-emitting device package mold 300 are set vertically so that the injection hole 311 is positioned to be vertically low and the discharge hole 312 is positioned to be vertically high. And then a molding resin is injected into a space between the substrate 110 and the light-emitting device package mold 300 through the injection member 340. While the molding resin fills an inner side of the convex unit 310, air in the convex unit 310 is discharged to the outside through the discharge hole 312. In particular, since the discharge hole 312 is formed in an air venting direction, air is readily discharged.

When the molding resin overflows from the convex unit 310, the molding resin that flows over the discharge member 350 may remain in the cylindrical unit 330 because the height of the cylindrical unit 330 is higher than that of the discharge member 350, and thus, the contamination of an external environment due to the overflow of the molding resin may be prevented.

Figure 5:
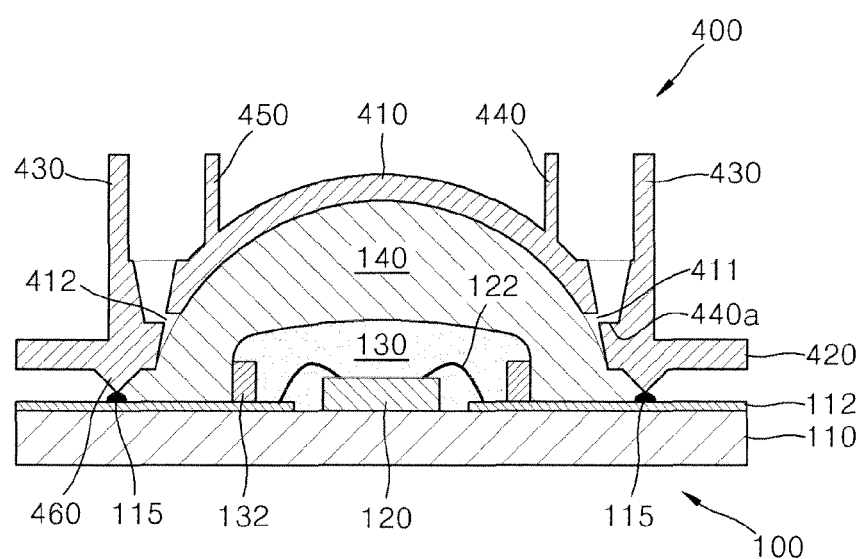
FIG. 5 is a schematic cross-sectional view showing a structure of a light-emitting device package mold according to another embodiment of the present disclosure.

FIG. 5 is a schematic cross-sectional view showing a structure of a light-emitting device package mold 400 according to another embodiment of the present disclosure. For convenience of understanding, the light-emitting device package 100 of FIG. 1 is illustrated.

Referring to FIG. 5, the light-emitting device package mold 400 for forming the lens 140 of the light-emitting device package 100 is disposed on the substrate 110. The light-emitting device package mold 400 may be at least a mold for forming a lens. The light-emitting device package mold 400 includes a convex unit 410, an inner circumference portion which has a hemispherical shape, a flat panel unit 420 horizontally extending outwards from an edge of the convex unit 410, and a cylindrical unit 430 extending vertically upwards from an upper surface of the flat panel unit 420. The convex unit 410 includes two through holes. One of the through holes is an injection hole 411 for injecting a molding resin and the other of the through holes is a discharge hole 412 for discharging air in a space surrounded by the convex unit 410 to the outside.

The injection hole 411 and the discharge hole 412 are respectively separated from the flat panel unit 420 with predetermined gaps, and may be formed on locations facing each other on the convex unit 410. The injection hole 411 is formed substantially parallel to the extending direction of the cylindrical unit 430. The injection hole 411 is surrounded by an injection member 440 and extends in a vertical direction with respect to the flat panel unit 420. An inner diameter of the injection member 440 connected to the injection hole 411 may gradually increase upwards. This makes the molding resin be readily injected into the injection member 440.

The discharge hole 412 is formed substantially parallel to the extending direction of the cylindrical unit 430. The discharge hole 412 is surrounded by a discharge member 450 and extends in a vertical direction with respect to the flat panel unit 420. The diameter of the discharge member 450 connected to the discharge hole 312 may gradually increase upwards.

From the flat panel unit 420, an upper edge of the discharge member 450 may be lower than an upper edge of the cylindrical unit 430.

The injection member 440 may have a cylindrical shape. A portion of the injection member 440 may be connected to an inner wall of the cylindrical unit 330 and may be formed as one body with the cylindrical unit 430.

When a molding resin is injected from the injection hole 411 with a high pressure, the pressure of molding resin is not directly transmitted to the substrate 110 but is applied to a lower part 440a of the injection member 440, and thus, the leaking of the molding resin through a gap between the substrate 110 and the mold 410 may be prevented.

A protrusion unit 460 that surrounds an edge of the convex unit 410 is formed on a lower surface of the flat panel unit 420. The protrusion unit 460 defines an outer circumference of the lens 140. The protrusion unit 460 may make a line contact with the substrate 110 since an edge of the protrusion unit 460 that contacts the substrate 110 is sharpened. The protruding ring 115 may be formed on the substrate 110, and the protrusion unit 460 may be disposed on the protruding ring 115. The protruding ring 115 makes a line contact with the protrusion unit 460, and prevents the molding resin from leaking between the substrate 110 and the protrusion unit 460.

Other elements and the operation of the light-emitting device package mold 400 are substantially identical to those of the light-emitting device package mold 300 of FIGS. 3 and 4, and thus, the detailed description thereof is omitted.

In FIG. 5, the injection hole 411 is formed parallel to the flat panel unit 420, but the present disclosure is not limited thereto. In the current embodiment, the injection hole 411 may be formed with an inclination with respect to the flat panel unit 420 and may be designed so that the pressure of the injected molding resin is directly transmitted to the lower part 440a of the injection member 440.

Figure 6:
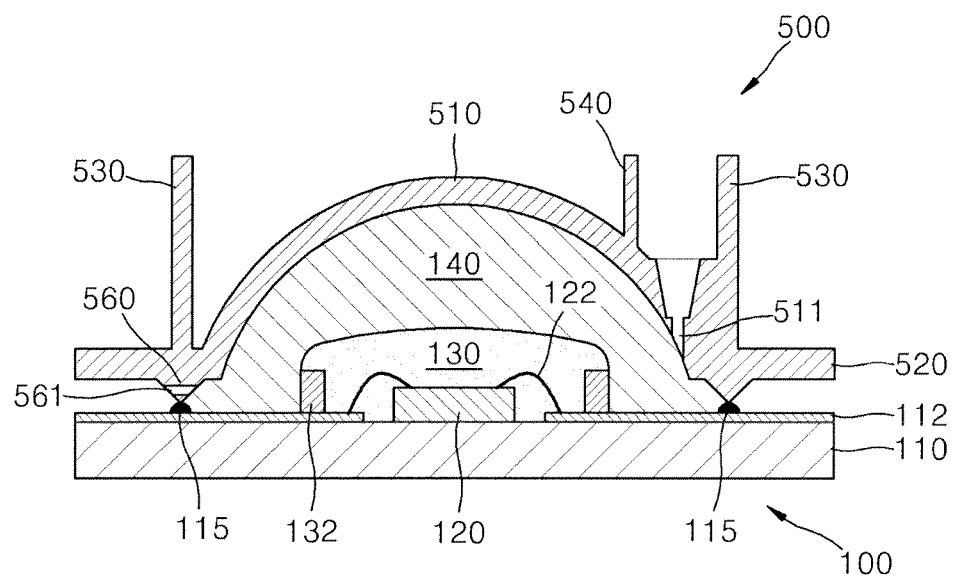
FIG. 6 is a schematic cross-sectional view showing a structure of a light-emitting device package mold according to still another embodiment of the present disclosure.

FIG. 6 is a schematic cross-sectional view showing a structure of a light-emitting device package mold 500 according to another embodiment of the present disclosure. For convenience of understanding, the light-emitting device package 100 of FIG. 1 is illustrated in FIG. 6.

Referring to FIG. 6, the light-emitting device package mold 500 for forming the lens 140 of the light-emitting device package 100 is disposed on the substrate 110. The light-emitting device package mold 500 may be at least a mold for forming a lens. The light-emitting device package mold 500 includes a convex unit 510, an inner circumference portion 513, which has a hemispherical shape, a flat panel unit 520 extending in a direction parallel to the substrate 110 from an edge of the convex unit 510, and a cylindrical unit 530 extending vertically upwards from an upper surface of the flat panel unit 520. The convex unit 510 includes at least one through hole. The through hole may be an injection hole 511 for injecting a molding resin.

A protrusion unit 560 that surrounds an edge of the convex unit 510 is formed on a lower surface of the flat panel unit 520. The protrusion unit 560 defines an outer circumference of the lens 140. The protrusion unit 560 may make a line contact with the substrate 110, since an edge of the protrusion unit 560 that contacts the substrate 110 is sharpened.

The protruding ring 115 may be formed on the substrate 110, and the protrusion unit 560 may be disposed on the protruding ring 115. The protruding ring 115 makes a line contact with the protrusion unit 560, and prevents the molding resin from leaking from a space between the substrate 110 and the protrusion unit 560 to the outside.

When the light-emitting device package mold 500 makes a line contact with the substrate 110, the sealing between an inner side of the convex unit 510 and the substrate 110 may be improved when the light-emitting device package mold 500 and the substrate 110 are clamped. Accordingly, the leaking of a molding resin may be prevented. That is, when the convex unit 510 and the substrate 110 are clamped, a pressure applied to the light-emitting device package mold 500 is concentrated on the edge of the protrusion unit 560. Therefore, the leaking of a molding between the substrate 110 and the protrusion unit 560 may be prevented with a low pressure.

Figure 7:
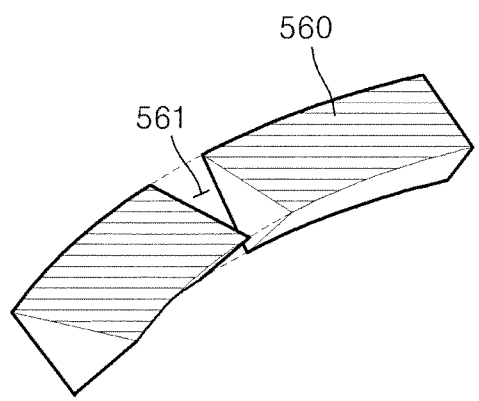
FIG. 7 is a perspective view of a protrusion unit of FIG. 6, according to an embodiment of the present disclosure.

The protrusion unit 560 includes a discharge unit 561. As shown in FIG. 6, the discharge unit 561 may be the discharge hole, which discharges air in a space surrounded by the convex unit 510 to the outside FIG. 7 is a perspective view of the protrusion unit 560 of FIG. 6, according to an embodiment of the present disclosure. Referring to FIG. 7, the discharge unit 561 may be an opening portion where the protrusion unit 560 is not formed.

The discharge unit 561 according to the current embodiment may have various shapes besides the shape shown in FIG. 6 and FIG. 7, and the descriptions thereof are omitted.

The injection hole 511 is separated from the flat panel unit 520 by a predetermined height. The injection hole Sills formed in a direction substantially parallel to an extending direction of the cylindrical unit 530, and is surrounded by the injection member 540. The inner diameter of the injection member 540 connected to the injection hole 511 gradually increases upwards. This allows a molding resin to be readily injected into the injection member 540 from the outside.

The injection member 540 may be formed as one body with the cylindrical unit 530, as the injection member 440 in FIG. 5.

The location of the injection hole 511 may be closer to the flat panel unit 520 than a vertical middle point of the convex unit 510. The discharge unit 561 may be formed on the protrusion unit 560 to face the injection hole 511.

The structures of the injection hole 511 and the injection member 540 may be the same as those of the injection hole 411 and the injection member 440 of FIG. 5.

The light-emitting device package mold 500 may be formed of a transparent material, for example, a transparent resin. The transparent resin may be one selected from the group consisting of silicon, urethane resin, oxetane resin, acryl, polycarbonate, and polyimide. Because the light-emitting device package mold 500 is formed of a transparent material, when a molding resin is injected into a gap between the substrate 110 and the light-emitting device package mold 500, the degree of filling of the molding resin may be checked with bare eyes.

In FIG. 6, a cross-section of the protrusion unit 560 has a triangular shape, but is not limited thereto. In the current embodiment, the cross-section of the protrusion unit 560 may have a hemispherical shape or a quadrangular shape.

In order to inject a molding resin into a space between the convex unit 510 and the substrate 110, air inside the convex unit 510 is discharged through the discharge unit 561.

Next, when a molding resin is injected into the convex unit 510 through the injection member 540 in a state that the substrate 110 is set vertically, a space between the substrate 110 and the convex unit 510 is filled with the molding resin. In a process of filling the space between the substrate 110 and the convex unit 510 with the molding resin, since there is no air in the space, almost no air pores may be generated in the space. Even though air pores are generated in the space, air is readily discharged through the discharge unit 561 located vertically.

According to the present disclosure, a discharge hole is formed in an air discharge direction, and thus, air is readily discharged to the outside when a molding resin is injected into a light-emitting device package mold.

Also, a pressure of a molding resin is applied to the light-emitting device package mold when the molding resin is injected, and thus, the pressure of the molding resin injected into the light-emitting device package mold is reduced, thereby preventing leaking of the molding resin.

Also, because a leaked molding resin remains on a outer surface of the light-emitting device package mold, the formation of the molding resin on a substrate is prevented, and thus, a pick-up process may be smoothly performed with a low pressure.

While this invention has been particularly shown and described with reference to preferred embodiments thereof, it will be understood by those of ordinary skill in the art that various changes in form and details may be made therein without departing from the spirit and scope of the invention as defined by the appended claims.

What is claimed is:

1. A light-emitting device package mold comprising:
    a convex unit, of which an inner circumference has a hemispherical shape;
    a flat panel unit that forms a flat panel by extending from an edge of the convex unit;
    a cylindrical unit extending in a vertical direction with respect to an upper surface of the flat panel unit; and
    an injection hole and a discharge hole that penetrate through the convex unit, wherein the discharge hole extends in a direction substantially parallel to the flat panel unit.

2. The light-emitting device package mold of claim 1, wherein the injection hole and the discharge hole located separate from the flat panel unit.

3. The light-emitting device package mold of claim 1, wherein the injection hole and the discharge hole are respectively closer to the flat panel unit than a vertical middle point of the convex unit.

4. The light-emitting device package mold of claim 1, wherein the light-emitting device package mold is formed of a transparent material.

5. The light-emitting device package mold of claim 1, further comprising a protrusion unit that protrudes in a direction opposite to the extending direction of the cylindrical unit from a lower surface of the flat panel unit and surrounds an edge of the convex unit.

6. The light-emitting device package mold of claim 1, wherein the discharge hole faces the injection hole in a horizontal direction with respect to the flat panel unit.

7. The light-emitting device package mold of claim 6, further comprising an injection member that is connected to the injection hole and extends in a vertical direction.

8. The light-emitting device package mold of claim 6, wherein the injection hole and the discharge hole are positioned to be separate from the flat panel unit.

9. The light-emitting device package mold of claim 6, wherein the injection hole and the discharge hole are respectively closer to the flat panel unit than a vertical middle point of the convex unit.

10. The light-emitting device package mold of claim 6, wherein the light-emitting device package mold is formed of a transparent material.

11. The light-emitting device package mold of claim 6, further comprising a protrusion unit that protrudes in a direction opposite to the extending direction of the cylindrical unit from a lower surface of the flat panel unit and surrounds an edge of the convex unit.

12. A light-emitting device packaging molding device, comprising:
    a light-emitting device package including a substrate, and a light-emitting device (LED) chip disposed on the substrate;
    a protruding ring disposed on the substrate and circling around the LED chip at a predetermined distance from the LED chip; and
    a light-emitting device package mold including:
        a convex unit, of which an inner circumference has a hemispherical shape;
        a flat panel unit by extending from an edge of the convex unit;
        a cylindrical unit extending in a vertical direction with respect to an upper surface of the flat panel unit;
        a protrusion unit that protrudes in a direction opposite to the extending direction of the cylindrical unit from the flat panel unit and surrounds an edge of the convex unit; and
        an injection hole that penetrates through the convex unit,
    wherein the protruding ring contacts with the protrusion unit to seal a space defined by the convex unit and the substrate.

13. The light-emitting device packaging molding device of claim 12, wherein the protrusion unit has at least one opening.

14. The light-emitting device packaging molding device of claim 12, wherein the at least one opening extends in a direction substantially parallel to the flat panel unit.

15. The light-emitting device packaging molding device of claim 12, wherein the injection hole extends in the vertical direction, and an inner diameter of the injection hole increases in the vertical direction.

16. The light-emitting device packaging molding device of claim 12, wherein the protruding ring forms a circular contact line with the protrusion unit.

* * * * *

UNITED STATES PATENT AND TRADEMARK OFFICE
CERTIFICATE OF CORRECTION

| | | |
|---|---|---|
| PATENT NO. | : 8,791,497 B2 | Page 1 of 1 |
| APPLICATION NO. | : 13/677109 | |
| DATED | : July 29, 2014 | |
| INVENTOR(S) | : Hun-yong Park et al. | |

It is certified that error appears in the above-identified patent and that said Letters Patent is hereby corrected as shown below:

On the title page item (72), fourth inventor's name should read,

Jonq-o Lim

Signed and Sealed this
Fourteenth Day of April, 2015

Michelle K. Lee
*Director of the United States Patent and Trademark Office*

UNITED STATES PATENT AND TRADEMARK OFFICE
CERTIFICATE OF CORRECTION

PATENT NO.          : 8,791,497 B2                                    Page 1 of 1
APPLICATION NO.     : 13/677109
DATED               : July 29, 2014
INVENTOR(S)         : Hun-yong Park et al.

It is certified that error appears in the above-identified patent and that said Letters Patent is hereby corrected as shown below:

On the title page item (72), fourth inventor's name should read,

Jong-o Lim

This certificate supersedes the Certificate of Correction issued April 14, 2015.

Signed and Sealed this
Twenty-fifth Day of August, 2015

Michelle K. Lee
*Director of the United States Patent and Trademark Office*